(12) United States Patent
Mori et al.

(10) Patent No.: US 9,579,695 B2
(45) Date of Patent: Feb. 28, 2017

(54) SUBSTRATE CLEANING APPARATUS AND SUBSTRATE CLEANING UNIT

(71) Applicant: TOKYO ELECTRON LIMITED, Tokyo (JP)

(72) Inventors: Kohei Mori, Kumamoto (JP); Hirokazu Tanaka, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 728 days.

(21) Appl. No.: 13/956,943

(22) Filed: Aug. 1, 2013

(65) Prior Publication Data
US 2014/0041696 A1 Feb. 13, 2014

(30) Foreign Application Priority Data

Aug. 7, 2012 (JP) ................................. 2012-175266

(51) Int. Cl.
*H01L 21/67* (2006.01)
*B08B 1/00* (2006.01)

(52) U.S. Cl.
CPC ........ *B08B 1/002* (2013.01); *H01L 21/67046* (2013.01); *H01L 21/67253* (2013.01)

(58) Field of Classification Search
CPC ......... H01L 21/67046; H01L 21/67253; B08B 1/002
See application file for complete search history.

(56) References Cited

U.S. PATENT DOCUMENTS

| 5,882,426 A * | 3/1999 | Yonemizu | B08B 1/007 134/32 |
| 6,491,760 B2 * | 12/2002 | Ishihara | B08B 1/04 134/25.4 |
| 2002/0029431 A1 * | 3/2002 | Oikawa | B08B 1/04 15/77 |
| 2011/0315458 A1 * | 12/2011 | Kusumoto | G01G 3/1412 177/201 |

FOREIGN PATENT DOCUMENTS

| JP | 07-307321 A | 11/1995 |
| JP | 08-243518 A | 9/1996 |
| JP | 09-326378 A | 12/1997 |
| JP | 2002-050602 A | 2/2002 |

* cited by examiner

*Primary Examiner* — Joseph L Perrin
*Assistant Examiner* — Irina Graf
(74) *Attorney, Agent, or Firm* — Abelman, Frayne & Schwab

(57) ABSTRACT

A substrate cleaning apparatus according to an exemplary embodiment of the present disclosure includes a cleaning body head unit, a first load detection unit, and a buoyancy imparting unit. In the cleaning body head unit, a cleaning body, a shaft configured to support the cleaning body, a rotating mechanism configured to rotate the shaft, and a base member are integrally retained by a base member. The first load detection unit includes one end connected to the base member of the cleaning body head unit to detect the load received from the cleaning body head unit. The buoyancy imparting unit is connected to the other end of the first load detection unit and imparts buoyancy to the cleaning body head unit via the first load detection unit.

11 Claims, 8 Drawing Sheets

SUBSTRATE CLEANING APPARATUS AND SUBSTRATE CLEANING UNIT

CROSS-REFERENCE TO RELATED APPLICATIONS

This application is based on and claims priority from Japanese Patent Application No. 2012-175266 filed on Aug. 7, 2012 with the Japan Patent Office and the disclosure of which is incorporated herein in its entirety by reference.

TECHNICAL FIELD

The present disclosure relates to a substrate cleaning apparatus and a substrate cleaning unit.

BACKGROUND

A scrub cleaning method has been known as a method for cleaning a substrate such as, e.g., a silicon wafer or a compound semiconductor wafer. The scrub cleaning method removes foreign substances attached to the front surface of a substrate by bringing a rotating brush or a rotating sponge into contact with the front surface of a substrate.

A substrate cleaning apparatus employing the scrub cleaning method is provided with a cleaning body such as, e.g., a brush at the lower end of a shaft which is rotated by a motor and moved up and down by an air cylinder. The contact force of the cleaning body on a substrate is adjusted by adjusting buoyancy generated by the air cylinder. A conventional substrate cleaning apparatus is provided with a sensor configured to detect total weight of, for example, the cleaning body and the shaft. A desired contact force may be obtained by generating the buoyancy of the air cylinder by the difference of a pre-set desired contact pressure and an output from the sensor.

Meanwhile, in the conventional substrate cleaning apparatus, a motor for rotating the shaft of the cleaning body is provided separately from the shaft and the rotation of the motor is transferred to the shaft by a transfer belt extended between a pulley attached to an output shaft of the motor and a pulley attached to the shaft, thereby rotating the cleaning body. See, e.g., Japanese Patent Laid-Open Publication No. H7-307321.

SUMMARY

The present disclosure provides a substrate cleaning apparatus including: a cleaning body head unit in which a cleaning body, a shaft configured to support the cleaning body, and a rotating mechanism configured to rotate the shaft are integrally retained by a base member; a first load detection unit of which one end is connected to the base member to detect a load received from the cleaning body head unit; and a buoyancy imparting unit connected to the other end of the first load detection unit to impart buoyancy to the cleaning body head unit via the first load detection unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
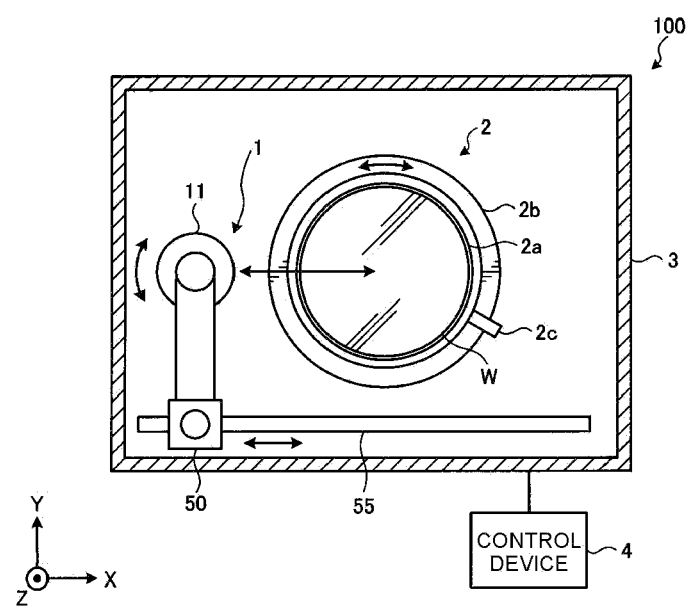
FIG. 1 is a schematic plan view illustrating a configuration of a scrub cleaning unit.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

There has been room for further improvement in a conventional substrate cleaning apparatus with respect to detecting a contact pressure of a cleaning body on a substrate accurately.

For example, a cleaning body may move up and down by an unevenness of a substrate. In such a case, a pulley attached to a shaft moves up and down along with the shaft but a pulley attached to a motor does not move up and down. Thus, a belt extended between the pulleys is inclined and the influence is transferred to a pressure sensor. As a result, it is possible that an accurate detection result may not be obtained.

One aspect of an exemplary embodiment is to provide a substrate cleaning apparatus and a substrate cleaning unit which may detect the contact pressure of a cleaning body accurately.

The substrate cleaning apparatus according to an aspect of the exemplary embodiment includes a cleaning body head unit, a first load detection unit, and a buoyancy imparting unit. The cleaning body head unit includes a cleaning body, a shaft configured to support the cleaning body, a rotating mechanism configured to rotate the shaft, and a base member configured to retain these components integrally. The first load detection unit is configured such that one end is connected to the base member of the cleaning body head unit to detect a load received from the cleaning body head unit. The buoyancy imparting unit is connected to the other end of the first load detection unit to impart buoyancy to the cleaning body head unit via the first load detection unit. The cleaning body may be substituted with a polishing member configured to remove a convex portion formed by contaminants attached to the rear surface of a substrate. In such a case, the substrate cleaning apparatus may be used as a substrate polishing apparatus.

In the substrate cleaning apparatus described above, the buoyancy imparting unit includes: a second base member connected to the other end of the first load detection unit; a guide part configured to support the second base member to be elevatable; an elevating mechanism configured to elevate the second base member; and a third base member configured to retain the elevating mechanism and the guide part.

In the substrate cleaning apparatus described above, the elevating mechanism includes an elevating shaft which is contactable/separable with respect to the second base member.

The substrate cleaning apparatus described above further includes a second load detection unit configured to detect a load received from the second base member.

In the substrate cleaning apparatus described above, the second load detection unit is retained by the third base member and is contactable/separable with respect to the second base member.

The substrate cleaning apparatus described above further includes a second elevating mechanism configured to elevate the third base member.

In the substrate cleaning apparatus described above, the rotating mechanism includes: a motor; a first pulley attached to an output shaft of the motor; a second pulley attached to the shaft; and a transfer member extended between the first pulley and the second pulley.

In the substrate cleaning apparatus described above, the first load detection unit is a Roberval-type load cell.

In the substrate cleaning apparatus described above, the first load detection unit is connected with a base member of the cleaning body head unit at the top surface of one end thereof and connected with the buoyancy imparting unit at the bottom surface of the other end thereof.

A substrate cleaning unit includes: a substrate holding unit configured to hold a substrate to be rotatable; a substrate cleaning apparatus configured to clean the substrate held by the substrate holding unit; and a control unit configured to control the substrate holding unit and the substrate cleaning apparatus. Also, the substrate cleaning apparatus includes: a cleaning body head unit in which a cleaning body, a shaft configured to support the cleaning body, and a rotating mechanism configured to rotate the shaft are integrally retained by a base member; a first load detection unit including one end connected to the base member of the cleaning body head unit to detect a load received from the cleaning body head unit; and a buoyancy imparting unit connected to the other end of the first load detection unit to impart buoyancy to the cleaning body head unit via the first load detection unit.

In the substrate cleaning unit described above, the buoyancy imparting unit includes: a second base member connected to the other end of the first load detection unit, a guide part configured to support the second base member to be elevatable, an elevating mechanism configured to elevate the second base member, and a third base member configured to retain the elevating mechanism and the guide part. Also, the substrate cleaning apparatus includes a second load detection unit configured to detect a load received from the second base member.

In the substrate cleaning unit described above, the control unit determines buoyancy imparted by the buoyancy imparting unit to the cleaning body head unit based on an output value of the second load detection unit and detects a contact pressure of the cleaning body on the substrate based on an output value of the first load detection unit.

According to one aspect of exemplary embodiments, the contact pressure of the cleaning body on a substrate may be detected accurately.

Hereinafter, exemplary embodiments of the substrate cleaning apparatus and the substrate cleaning unit of the present disclosure will be described in detail with reference to the attached drawings. However, the present disclosure is not limited to the following exemplary embodiments.

First Exemplary Embodiment

A schematic configuration of a scrub cleaning unit according to the first exemplary embodiment will be described first with reference to FIG. 1. FIG. 1 is a schematic plan view illustrating the configuration of the scrub cleaning unit.

Hereinafter, X-axis, Y-axis, and Z-axis which are orthogonal to one another are defined to make a positional relation clear and the positive direction of the Z-axis is set as a vertical upward direction.

As illustrated in FIG. 1, a scrub cleaning unit 100 according to the first exemplary embodiment is an example of the substrate cleaning unit disclosed in the present application and is provided with a substrate cleaning apparatus 1 and a substrate holding unit 2 within a chamber 3.

The substrate cleaning apparatus 1 is an apparatus of scrub cleaning a wafer W held by the substrate holding unit 2. Specifically, the substrate cleaning apparatus 1 is provided with a cleaning body 11 such as, e.g., a brush or a sponge, and to be rotatable. When the cleaning body 11 is rotated while being contacted with the wafer W, foreign substances attached to the front surface of wafer W are removed.

Also, an elevating mechanism 50 configured to move the cleaning body 11 along the vertical direction and a moving mechanism 55 configured to move the elevating mechanism 50 horizontally along the X-axis are provided at the base end of the substrate cleaning apparatus 1. The substrate cleaning apparatus 1 scrub-cleans the entire front surface of the wafer W rotated by the substrate holding unit 2 (described later) by rotating the cleaning body 11, then lowering the cleaning body 11 to come into contact with the front surface of the wafer W using the elevating mechanism 50, and then moving the elevating mechanism 50 using the moving mechanism 55.

The substrate holding unit 2 includes: a rotation maintaining mechanism 2a configured to hold a wafer W horizontally and to rotate the held wafer W around a vertical axis, and a cup 2b disposed to surround the rotation maintaining mechanism 2a. The substrate holding unit 2 rotates the wafer W by the rotation maintaining mechanism 2a and recovers cleaning liquid scattered outward of the wafer W by centrifugal force generated due to the rotation of the wafer W using the cup 2b.

Meanwhile, the substrate holding unit 2 includes a nozzle 2c configured to supply DIW ("deionized water") onto a wafer W. The front surface of the wafer W is suppressed from being dried by supplying DIW on the wafer W by such a nozzle 2c during a substrate cleaning processing, which will be described later. Here, although the nozzle 2c is provided at an upper portion of the cup 2b, a turning mechanism configured to turn the nozzle 2c to the processing position may be provided within the chamber 3 and the nozzle 2c may be provided at the front end of the turning mechanism.

Also, the scrub cleaning unit 100 is provided with a control device 4 outside of the chamber 3. The control device 4 is a device configured to control the operation of the scrub cleaning unit 100. Such a control device 4 is, for example, a computer and is provided with a control unit and a storage unit, which are not illustrated. The storage unit stores a program which controls various processings such as, e.g., a substrate cleaning processing. The control unit controls the operation of the scrub cleaning unit 100 by reading out the program stored in the storage unit and then executing it.

Meanwhile, such a program is stored in a storage medium which is readable by a computer and the program may be installed in the storage unit of the control device 4 from the storage medium. As for the storage medium readable by a computer, there are, for example, a hard disk ("HD"), a flexible disk ("FD"), a compact disk ("CD"), a magnet optical disk ("MO"), and a memory card.

Here, the substrate cleaning apparatus that employs the scrub cleaning method adjusts a contact pressure of the cleaning body on a wafer W by lifting the shaft that supports the cleaning body with a predetermined buoyancy using, for example, e.g., an air cylinder. Specifically, the substrate cleaning apparatus may be provided with a sensor configured to detect a total weight of, for example, the cleaning body and the shaft and obtain a desired contact pressure by generating the buoyancy by the difference of a pre-set desired contact pressure and an output from the sensor.

However, in the conventional substrate cleaning apparatus, a motor configured to rotate the shaft of the cleaning body is provided as a separate member from the shaft and the cleaning body is rotated by transferring the rotation of the motor to the shaft by a transfer belt extended between a pulley attached to the shaft and a pulley attached to an output shaft of the motor. Thus, when the cleaning body is moved up and down due to an unevenness of a wafer, the belt extended between the pulleys is inclined and thus, the contact pressure of the cleaning body on the wafer may not be detected accurately.

Therefore, the substrate cleaning apparatus 1 according to the first exemplary embodiment is configured to accurately detect the contact pressure of the cleaning body 11 on a wafer W by researching the arrangement of the rotating mechanism configured to rotate the cleaning body 11 or a sensor configured to detect the contact pressure of the cleaning body 11 on the wafer W. Hereinafter, a configuration of such a substrate cleaning apparatus 1 will be described in detail.

Figure 2:
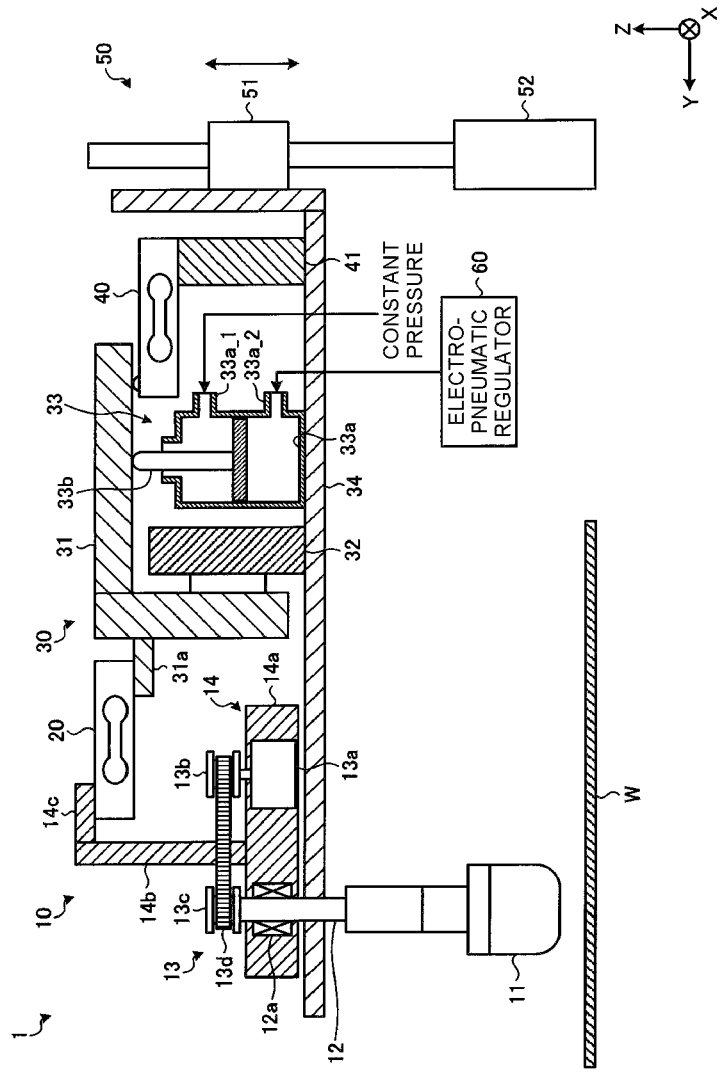
FIG. 2 is a schematic side view illustrating a configuration of a substrate cleaning apparatus according to a first exemplary embodiment.

FIG. 2 is a schematic side view illustrating the configuration of the substrate cleaning apparatus according to the first exemplary embodiment. As illustrated in FIG. 2, the substrate cleaning apparatus 1 includes a cleaning body head unit 10, a first load detection unit 20, a buoyancy imparting unit 30, a second load detection unit 40, and the elevating mechanism 50.

The cleaning body head unit 10 includes a cleaning body 11, a shaft 12, a rotating mechanism 13, and a first base member 14. The cleaning body 11 is, for example, a brush or a sponge and the lower end surface of the cleaning body 11 faces the front surface of the wafer W. The shaft 12 is an elongated member extending in the vertical direction. The lower end of the shaft 12 is connected to the top portion of the cleaning body 11 to support the cleaning body 11.

The rotating mechanism 13 rotates the shaft 12 around the vertical axis. Specifically, the rotating mechanism 13 includes a motor 13a, a first pulley 13b, a second pulley 13c, and a transfer belt 13d. The motor 13a is provided in the vicinity of the shaft 12 in the direction where the output shaft becomes parallel to the shaft 12. The first pulley 13b is attached to the front end of the output shaft of the motor 13a and the second pulley 13c is attached to the front end of the shaft 12. The first pulley 13b and second pulley 13c are arranged at the same height and the transfer belt 13d is extended therebetween.

In such a rotating mechanism 13, when the motor 13a rotates the output shaft, the first pulley 13b rotates according to the rotation of the output shaft. The rotation of the first pulley 13b is transferred to the second pulley 13c by the transfer belt 13d. Also, when the second pulley 13c rotates, the shaft 12 and the cleaning body 11 rotate.

The first base member 14 is configured to integrally retain the cleaning body 11, the shaft 12, and the rotating mechanism 13 and includes a main body portion 14a, a supporting portion 14b, and a first connecting portion 14c.

The main body portion 14a retains the shaft 12 and the motor 13a. The shaft 12 and the output shaft of the motor 13a extend from the main body portion 14a, and the first pulley 13b, the second pulley 13c, and the delivery belt 13d are disposed above the main body portion 14a. Also, the shaft 12 is rotatably retained in the main body portion 14a via a bearing 12a.

The supporting portion 14b is a member extending in the vertical direction and the lower end portion of the supporting portion 14b is fixed to the top portion of the main body portion 14a. The first connecting portion 14c is a member extending in the horizontal direction and is provided on the top of the supporting portion 14b.

As described above, the cleaning body head unit 10 is configured such that the cleaning body 11, the shaft 12 configured to support the cleaning body 11, the rotating mechanism 13 configured to rotate the shaft 12 are integrally retained by the first base member 14. Accordingly, when the cleaning body 11 is moved up and down by an unevenness of a wafer W, the rotating mechanism 13 is also moved up and down integrally with the cleaning body 11. Thus, there is no concern that only one of the pulleys moves up and down to cause the transfer belt to be inclined as in the related art.

The first load detection unit 20 is configured to detect the contact pressure of the cleaning body 11 on the wafer W. Specifically, the first load detection unit 20 is a Roberval type load cell in which one end of a rectangular main body part (strain element) extending in the horizontal direction is connected with the first connecting portion 14c of the first base member 14 and the other end is connected with a second connecting portion 31a of a second base member 31 which will be described later.

The main body portion of the first load detection unit 20 is deformed by the load received from the cleaning body head unit 10. The first load detection unit 20 electrically detects the deformation amount of the main body portion by a guage attached to the main body portion to detect the load received from the cleaning body head unit 10.

As described above, the substrate cleaning apparatus 1 according to the first exemplary embodiment uses the first load detection unit 20 as a connecting member which connects the cleaning body head unit 10 and the buoyancy imparting unit 30. Especially, in the substrate cleaning apparatus 1 according to the first exemplary embodiment, the cleaning body head unit 10 and the buoyancy imparting unit 30 may be efficiently connected by using the Roberval type load cell as for the first load detection unit 20.

Meanwhile, the first connecting portion 14c of the first base member 14 and the second connecting portion 31a of the second base member 31 are fixed to the first load detection unit 20 by bolts, respectively. At this time, as illustrated in FIG. 2, when the first connecting portion 14c is connected on the top surface of the first load detection unit 20 and the second connecting portion 31a is connected to the bottom surface, the first connecting portion 14c and the second connecting portion 31a may be attached to the first load detection unit 20 more easily. In other words, the space required for attaching the first connecting portion 14c and the second connecting portion 31a may be reduced as compared to a case where the first connecting portion 14c is connected on the bottom surface of the first load detection unit 20 and the second connecting portion 31a is connected to the top surface. Thus, the cleaning body head unit 10 and the buoyancy imparting unit 30 may be connected more compactly.

The buoyancy imparting unit 30 includes a second base member 31, a guide part 32, an air cylinder 33, and a third base member 34. The second base member 31 includes the second connecting portion 31a extending in the horizontal direction and connected to the other end of the first load detection unit 20 for the second connecting portion 31a. The guide part 32 is a member configured to support the second base member 31 to be elevatable.

The air cylinder 33 is an elevating mechanism configured to elevate the second base member 31. Specifically, the air cylinder 33 includes a main body portion 33a formed with an upper supply part 33a_1 and a lower supply part 33a_2, and an elevating shaft 33b installed to be elevatable within the main body portion 33a. The air cylinder 33 moves the elevating shaft 33b using the pressure difference of the air supplied respectively from the upper supply part 33a_1 and the lower supply part 33a_2 of the main body portion 33a.

More specifically, the upper supply part 33a_1 is connected with an air supply source (not illustrated) which supplies air with constant pressure. Also, the lower supply part 33a_2 is connected with an electro-pneumatic regulator 60 which regulates the pressure of the air supplied to the lower supply part 33a_2 to a predetermined pressure. The substrate cleaning apparatus 1 generates desired buoyancy within the main body portion 33a to move the elevating shaft 33b by adjusting the pressure of the air supplied from the lower supply part 33a_2 by the electro-pneumatic regulator 60.

The third base member 34 is a member configured to retain the main body portion 33a of the air cylinder 33 and the guide part 32.

In the buoyancy imparting unit 30 configured as described above, the air cylinder 33 moves the elevating shaft 33b up and down which in turn moves the second base member 31 up and down. Accordingly, the second base member 31 moves up and down along the guide part 32, and the first load detection unit 20 connected to the second base member 31 and the cleaning body head unit 10 connected to the first load detection unit 20 move up and down.

As described above, the buoyancy imparting unit 30 is connected to the other end of the first load detection unit 20 to impart buoyancy to the cleaning body head unit 10 via the first load detection unit 20.

Meanwhile, the elevating shaft 33b of the air cylinder 33 is configured to be capable of being contacted or separated (hereinafter, described as "contactable/separable") with respect to the second base member 31. Accordingly, when the cleaning body 11 receives a big drag from a wafer W accidently, the second base member 31 is spaced apart from the elevating shaft 33b so that the cleaning body head unit 10 may be moved upward. Thus, a big load may be suppressed from being applied to the wafer W.

Here, although it is exemplified that the air cylinder 33 is used as the elevating mechanism, the elevating mechanism may be something other than the air cylinder as long as the elevating mechanism is able to elevate the second base member 31.

The second load detection unit 40 is a detection unit used to set the contact pressure of the cleaning body 11 on a wafer W to a desired contact pressure. Specifically, a support member 41 configured to support the second load detection unit 40 at a predetermined height is fixed to the third base member 34 and the second load detection unit 40 is fixed to the upper part of the support member 41. The second load detection unit 40 detects the load received from the second base member 31 as the top end portion of the second load detection unit 40 comes into contact with the bottom portion of the second base member 31. The load received from the second base member 31 is a total weight of the cleaning body head unit 10, the first load detection unit 20, and the second base member 31 in a state where the cleaning body 11 is not in contact with the wafer W.

Also, the second load detection unit 40 is held by the third base member 34 and configured to be contactable/separable with respect to the second base member 31. Therefore, the second load detection unit 40 may efficiently perform the determination and the processing of a buoyancy value which will be described later.

Here, although it is exemplified that the second load detection unit 40 is a Roberval type load cell like the first load detection unit 20, the second load detection unit 40 may be a detection unit other than the Roberval type load cell.

The elevating mechanism 50 is provided with a supporting member 51 configured to support the third base member 34 horizontally and an elevating part 52 configured to elevate the supporting member 51. As described above, the elevating mechanism 50 corresponds to a second elevating mechanism which elevates the third base member 34.

Figure 3:
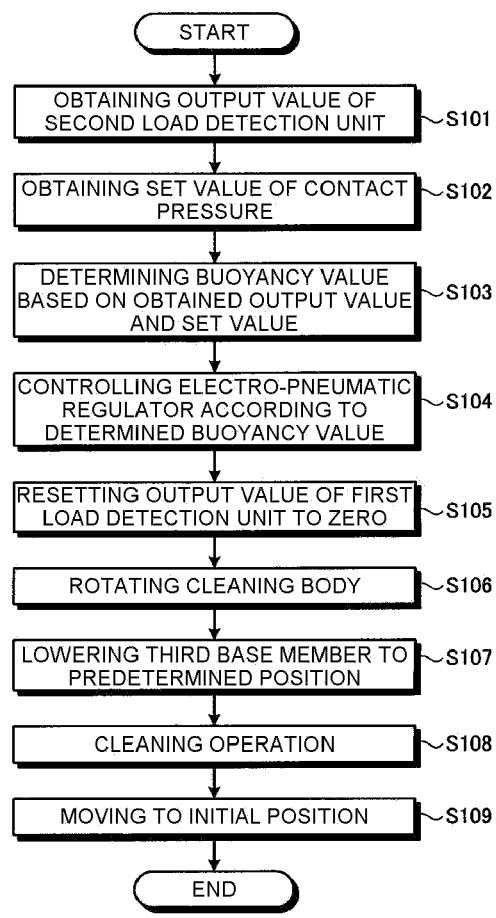
FIG. 3 is a flowchart illustrating a processing sequence of a substrate cleaning process according to the first exemplary embodiment.

Next, a detailed operation of the substrate cleaning apparatus 1 will be described with reference to FIG. 3. FIG. 3 is a flowchart illustrating a processing sequence of substrate cleaning processing according to the first exemplary embodiment. Meanwhile, before the substrate cleaning processing starts, the substrate cleaning apparatus 1 is in a standby state as illustrated in FIG. 2, that is, in a state in which the cleaning body 11 is not in contact with the wafer W.

As illustrated in FIG. 3, a control unit of a control device 4 obtains an output value of the second load detection unit 40 first (step S101). That is, the control unit obtains the total weight of the cleaning body head unit 10, the first load detection unit 20, and the second base member 31. Meanwhile, in the standby state illustrated in FIG. 2, it is assumed that no buoyancy is exerted on the second base member 31 by the air cylinder 33.

Also, the control unit obtains a set value of the contact pressure stored in the storage unit of the control device 4 (step S102). The set value of the contact pressure is a value set beforehand by a user and may be properly changed.

Subsequently, the control unit determines a buoyancy value imparted to the cleaning body head unit 10 based on the output value of the second load detection unit 40 obtained in step S101 and the set value of the contact pressure obtained in step S102 (step S103). Specifically, the control unit determines the difference between the output value of the second load detection unit 40 (that is, the total weight of the cleaning body head unit 10, the first load detection unit 20, and the second base member 31) and the set value of the contact pressure as the buoyancy value.

Then, the control unit controls the electro-pneumatic regulator 60 according to the determined buoyancy value (step S104). That is, the pressure of the air supplied to the air cylinder 33 from the electro-pneumatic regulator 60 is regulated such that the buoyancy value determined in step S103 may be obtained. Accordingly, the desired buoyancy is imparted to the second base member 31 from the elevating shaft 33b of the air cylinder 33 and the buoyancy is transferred to the cleaning body head unit 10 via the first load detection unit 20. Therefore, the cleaning body head unit 10 becomes a state in which it is lifted by the desired buoyancy.

Here, although the setting value of the contact pressure is obtained after the output value of the second load detection unit 40 is obtained, the sequence of obtaining the output value and set value may be reversed.

Also, the control unit obtains the output values of the first load detection unit 20 and resets the obtained output value to zero (step S105). That is, the load received from the cleaning body head unit 10 (that is, the weight of the cleaning body head unit 10) is set to zero in a state in which the cleaning body 11 is not in contact with the wafer W. Accordingly, the control unit may detect the contact pressure of the cleaning body 11 on the wafer W easily by reversing the obtained value from the load detection unit 20 during a cleaning operation which will be described later.

Figure 4A:
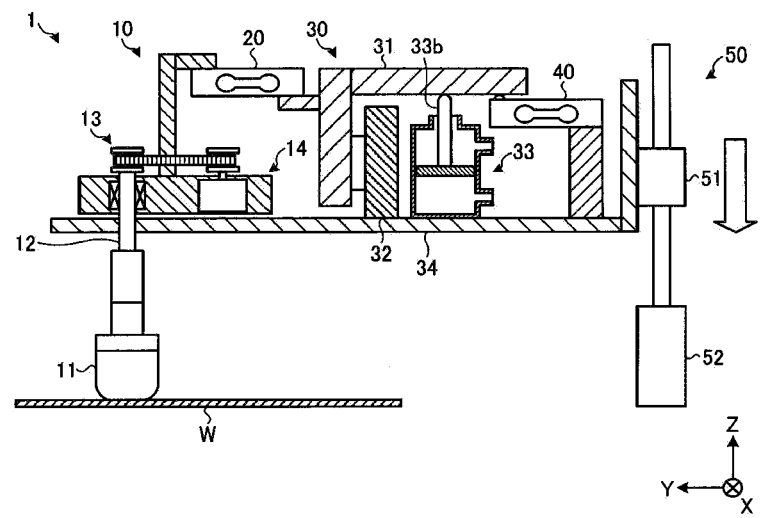
FIGS. 4A and 4B are views each illustrating an operational example of the substrate cleaning apparatus.
Figure 4B:
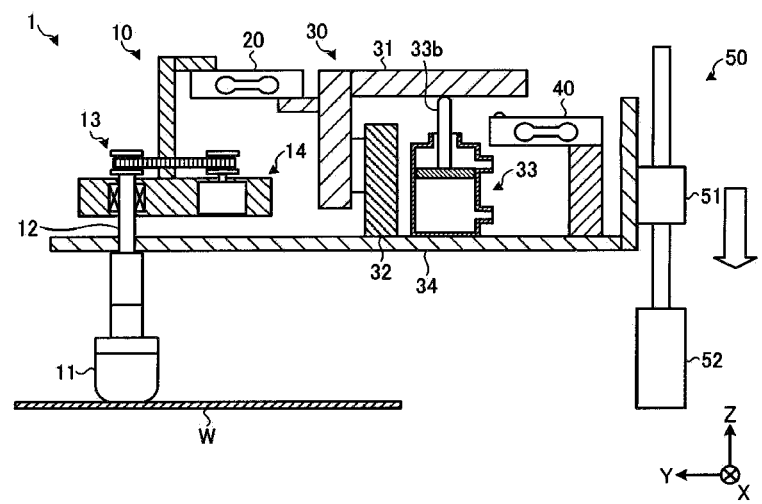

Subsequently, the control unit rotates the cleaning body 11 by operating the rotating mechanism 13 (see, e.g., FIG. 2) (step S106) and then the third base member 34 is lowered to the predetermined position using the elevating mechanism 50 (see, e.g., FIG. 2) (step S107). Here, the operation of step S107 is described in detail using FIGS. 4A and 4B. FIGS. 4A and 4B illustrate examples of operating the substrate cleaning apparatus 1.

As described in FIG. 4A, the control unit causes the cleaning body 11 to come into contact with the front surface of the wafer W by lowering the third base member 34 using the elevating mechanism 50. Subsequently, as described in FIG. 4B, the control unit separates the second base member 31 from the second load detection unit 40 by further lowering the third base member 34 by about 2 mm.

Accordingly, the cleaning body head unit 10, the first load detection unit 20, and the second base member 31 are supported by the elevating shaft 33b of the air cylinder 33 and the wafer W. In other words, the buoyancy received from the air cylinder 33 and the drag received from the wafer W become similar to the total weight of the cleaning body head unit 10, the first load detection unit 20, and the second base member 31. At this time, the force obtained by subtracting the buoyancy of the air cylinder 33 from the total weight of the cleaning body head unit 10, the first load detection unit 20, and the second base member 31, that is, the desired contact pressure set beforehand is exerted on the wafer W.

The load the first load detection unit 20 receives from the cleaning body head unit 10 decreases by the amount of the contact pressure. Thus, the output value of the first load detection unit 20 is reduced by the amount of the above-described contact pressure. Therefore, the control unit may detect the changed amount of the output value with the contact pressure of the cleaning body 11 on the wafer W. Moreover, since the output value of the first load detection unit 20 is reset to zero in step S105, detection of the contact pressure may be performed easily.

Here, although it is exemplified that the output value of the first load detection unit 20 is reset to zero in step S105, the control unit may store the output value of the first load detection unit 20 before contacting the cleaning body with the wafer W and calculate the difference between the output value before the contact and the output value after the contact to detect the contact pressure on the wafer W.

Meanwhile, the control unit rotates the wafer W by controlling the substrate holding unit 2 in any timing until the cleaning body 11 comes into contact with the front surface of the wafer W after starting the substrate cleaning processing.

Referring back to FIG. 3, descriptions on the contents of the substrate cleaning processing will be continued. When the processing of step S107 is ended, the control unit starts the cleaning operation (step S108). That is, as described above with reference to FIG. 1, the control unit moves the elevating mechanism 50 by using the moving mechanism 55 so that the entire front surface of the wafer W rotated by the substrate holding unit 2 may be scrub-cleaned. The control unit detects the contact pressure of the cleaning body 11 on the wafer W during the cleaning operation by using the first load detection unit 20.

When the cleaning operation of step S108 is ended, the control unit moves to the initial position (position illustrated in FIG. 1) (step S109), stops the rotation of the wafer W by the substrate holding unit 2, and then ends the substrate cleaning processing.

As described above, the substrate cleaning apparatus 1 according to the first exemplary embodiment may detect the contact pressure of cleaning body 11 on the wafer W during the cleaning operation since the cleaning body head unit 10 and the buoyancy imparting unit 30 are connected by the first load detection unit 20.

In addition, since the rotating mechanism 13 is integrally retained by the first base member 14, there is no concern that the transfer belt 13d is inclined even if the cleaning body 11 moves up and down due to the unevenness of the wafer W and the detection of the contact pressure using the first load detection unit 20 may be performed accurately.

As described above, the substrate cleaning apparatus 1 according to the first exemplary embodiment includes a cleaning body head unit 10, a first load detection unit 20, and a buoyancy imparting unit 30. The cleaning body head unit 10 includes a cleaning body 11, a shaft 12 configured to support the cleaning body 11, a rotating mechanism 13 configured to rotate the shaft 12, and a first base member 14 configured to retain these components integrally. The first load detection unit 20 is connected to the first base member of the cleaning body head unit 10 at one end thereof to detect the load received from the cleaning body head unit 10. The buoyancy imparting unit 30 is connected to the other end of the first load detection unit 20 to impart buoyancy to the cleaning body head unit 10 via the first load detection unit 20. Thus, according to the substrate cleaning apparatus 1 of the first exemplary embodiment, the contact pressure of the cleaning body 11 on a wafer W may be detected accurately.

Second Exemplary Embodiment

In the above-described first exemplary embodiment, the substrate cleaning apparatus 1 is provided with the second load detection unit 40 and the buoyancy is determined based on the output value of the second load detection unit 40. However, the substrate cleaning apparatus doesn't have to include the second load detection unit 40. That is, the substrate cleaning apparatus may determine the buoyancy value without using the second load detection unit 40.

Figure 5:
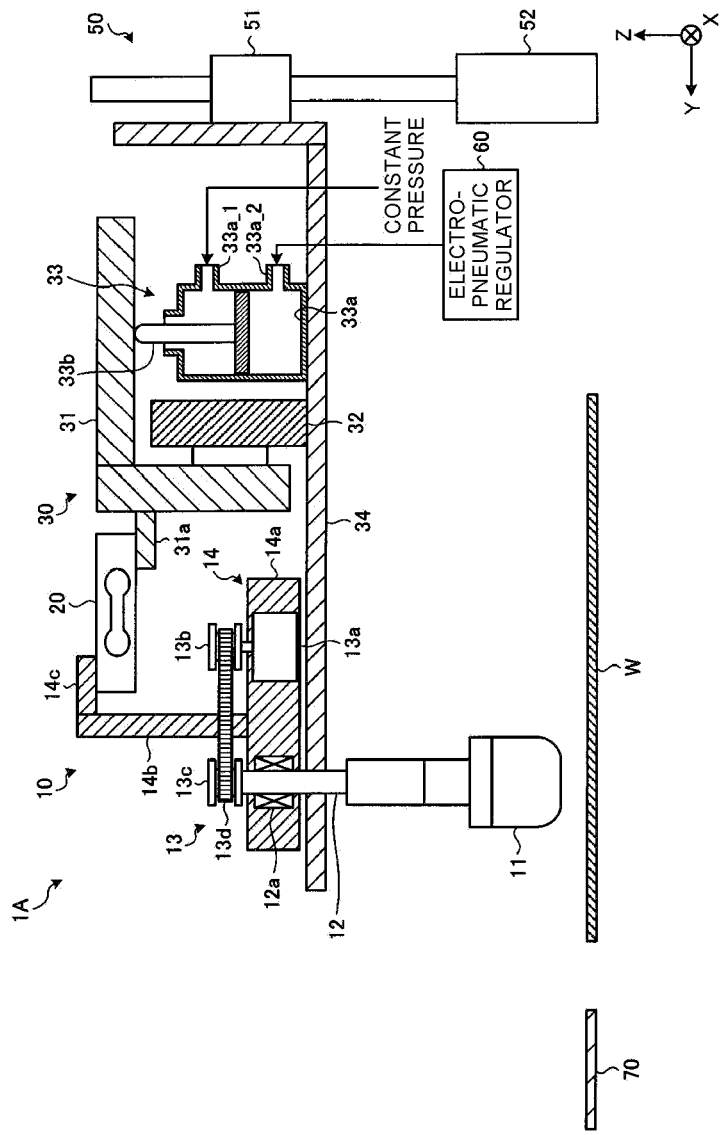
FIG. 5 is a schematic side view illustrating a configuration of a substrate cleaning apparatus according to a second exemplary embodiment.

Hereinafter, such a point will be described. FIG. 5 is a schematic side view illustrating a configuration of the substrate cleaning apparatus according to the second exemplary embodiment. Meanwhile, in the following descriptions, the same parts as the previously described ones will be assigned with the same symbols and redundant descriptions thereof will be omitted.

As illustrated in FIG. 5, the substrate cleaning apparatus 1A according to the second exemplary embodiment has a configuration in which the second load detection unit 40 and the support member 41 of the substrate cleaning apparatus 1 according to the first exemplary embodiment are omitted. Also, in the second exemplary embodiment, a stage 70 is provided within the chamber 3 (see, e.g., FIG. 1). The stage 70 is a member having a horizontal surface. It is desirable that the horizontal surface of the stage 70 is disposed at the same height of the front surface of a wafer W.

Figure 6:
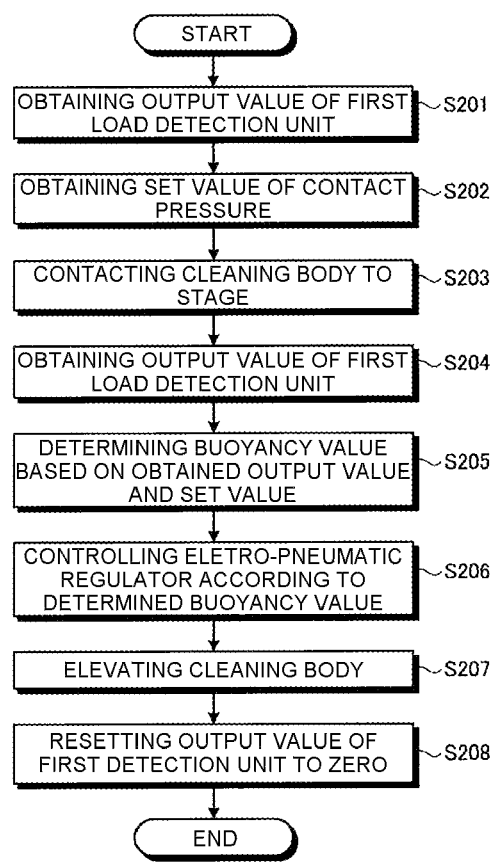
FIG. 6 is a flowchart illustrating a processing sequence of a buoyancy value determination according to the second exemplary embodiment.

Hereinafter, the contents of the buoyancy value determination processing executed by the substrate cleaning apparatus 1A according to the second exemplary embodiment will be described with reference to FIG. 6. FIG. 6 is a flowchart illustrating a processing sequence of the buoyancy value determination processing according to the second exemplary embodiment.

As illustrated in FIG. 6, the control unit obtains the output value of the first load detection unit 20 (step S201). That is, the control unit obtains the weight of the cleaning body head unit 10. Also, the control unit obtains the set value of the contact pressure, which has been stored beforehand (step S202). Meanwhile, as in the first exemplary embodiment, the processing sequence of step S201 and step S202 may be reversed.

Subsequently, the control unit lowers the cleaning body 11 by lowering the third base member 34 so that the cleaning body 11 comes into contact with the horizontal surface of the stage 70 (step S203). At this time, the control unit lowers the third base member 34 to the position illustrated in FIG. 4B, i.e. the position where the cleaning operation is being performed.

Subsequently, the control unit obtains the output value of the first load detection unit 20 again (step S204) and determines the buoyancy value based on the output values obtained in step S201 and step S204 and the set value obtained in step S202 (step S205). Specifically, the control unit calculates the contact pressure of the cleaning body 11 on the stage 70 first by subtracting the output value obtained in step S204 from the output value obtained in step S201. Also, the control unit may obtain the buoyancy value by subtracting the set value of the contact pressure obtained at step S202 from the calculated contact pressure.

Meanwhile, the processing of step S202 may be performed after the processing of step S203 or after the processing of step S204.

Subsequently, the control unit controls the electro-pneumatic regulator 60 according to the buoyancy value determined in step S205 (step S206). Accordingly, as in the first exemplary embodiment, the cleaning body head unit 10 becomes a state in which the cleaning body head unit 10 is lifted by desired buoyancy.

After lifting up the cleaning body 11 (step S207), the control unit obtains the output value of the first load detection unit 20 and resets the obtained output value to zero (step S208), thereby ending the buoyancy value determination processing. Meanwhile, the control unit performs the processing of steps S106 to S109 illustrated in FIG. 3 after ending the processing of step S208. Also, as in the first exemplary embodiment, the control unit rotates the wafer W by controlling the substrate holding unit 2 in any timing until the cleaning body 11 comes into contact with the front surface of a wafer W after the substrate cleaning processing is started.

As described above, the control unit may determine the buoyancy value without using the second load detection unit 40.

Figure 7:
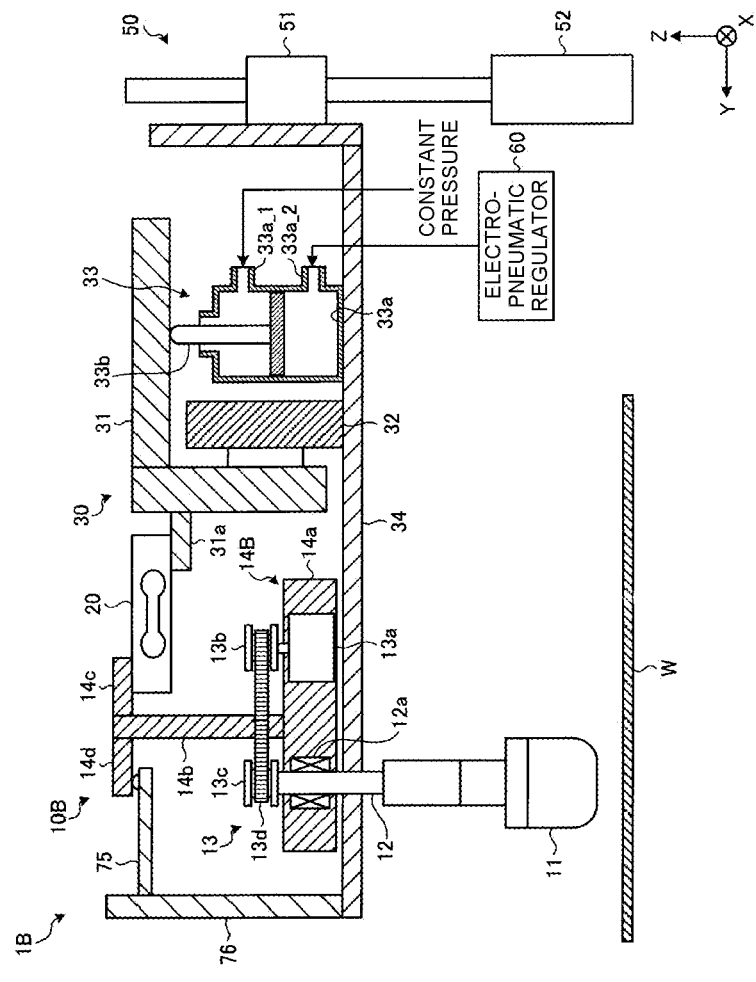
FIG. 7 is a schematic side view illustrating another configuration of the substrate cleaning apparatus according to the second exemplary embodiment.

Here, the buoyancy value is determined by using the stage 70 installed within the chamber 3. However, a member corresponding to the stage 70 may be provided for the substrate cleaning apparatus. An example of such a case will be described with reference to FIG. 7. FIG. 7 is a schematic side view illustrating another configuration of the substrate cleaning apparatus according to the second exemplary embodiment.

As illustrated in FIG. 7, a substrate cleaning apparatus 1B is provided with a cleaning body head unit 10B instead of the cleaning body head unit 10.

The cleaning body head unit 10B includes a first base member 14B instead of the first base member 14 provided in the cleaning body head unit 10 and the first base member 14B further includes a contact portion 14d. The contact portion 14d is a member extending in the horizontal direction and, for example, is provided at the side opposite to the connecting portion 14c in the top end of the supporting portion 14b.

Also, the substrate cleaning apparatus 1B is provided with a head support 75 and a support member 76. The head support 75 is a member extending in the horizontal direction and is disposed below the contacting portion 14d of the cleaning body head unit 10B. One end of the head support 75 is fixed to the support member 76 and the top portion of the other end is contactable/separable with respect to the contacting portion 14d.

The support member 76 is configured to support the head support 75 at a predetermined height and fixed to the front end of the third base member 34.

In the substrate cleaning apparatus 1B configured as described above, the buoyancy value of the air cylinder 33 is determined as follows.

Firstly, the control unit obtains the output value of the first load detection unit 20 (that is, the weight of the cleaning body head unit 10B) in the stand-by state (that is, the state in which the cleaning body 11 is not in contact with a wafer W and the contacting portion 14d of the cleaning body head unit 10B is not in contact with the head support 75) and resets the output value to zero.

Subsequently, the control unit lowers the elevating shaft 33b of the air cylinder 33 to the predetermined height so that the contacting portion 14d comes into contact with the head support 75. At this time, the output value of the first load detection unit 20 decreases by the load applied to the head support 75 (that is, the contact pressure of the contacting portion 14d on the head support 75).

The control unit adjusts the pressure of the air supplied from the electro-pneumatic regulator 60 such that the difference of the output values coincides with the set value of the contact pressure stored in the storage unit of control device 4 (see, e.g., FIG. 1). Accordingly, the buoyancy value is determined.

Subsequently, the control unit lowers the third base member 34 to the predetermined position so that the cleaning body 11 comes into contact with the front surface of the wafer W using the elevating mechanism 50 after rotating the cleaning body 11 by operating the rotating mechanism 13. And then, the control unit further lowers the third base member 34 by 2 mm so that the contacting portion 14d is spaced apart from the head support 75. Accordingly, the desired contact pressure is applied to the wafer. Meanwhile, the control unit rotates the wafer W by controlling the substrate holding unit 2 in any timing until the cleaning body 11 comes into contact with the front surface of the wafer W after the substrate cleaning processing is started.

The control unit may obtain the output value from the first load detection unit 20 during the cleaning operation and detect the contact pressure of cleaning body 11 on the wafer W by reversing the output value.

Third Exemplary Embodiment

Figure 8:
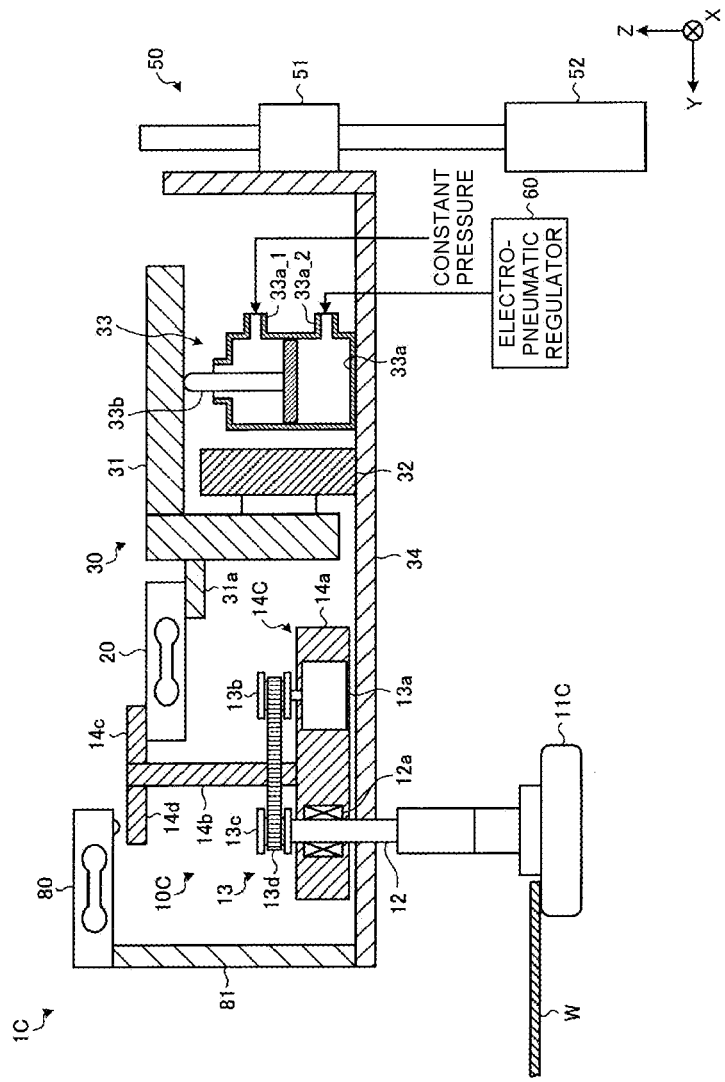
FIG. 8 is a schematic side view illustrating a configuration of the substrate cleaning apparatus according to a third exemplary embodiment.

The cleaning body is not limited to what has been exemplified in each of the above-described embodiments. For example, in each of the above-described exemplary embodiments, although a case in which a type of cleaning body that cleans the front surface of a wafer W is used has been exemplified. However, the cleaning body may be a type configured to come into contact with the rear surface of the wafer W to clean the circumferential edge of the rear surface of the wafer W. Hereinafter, such a point will be described with reference to FIG. 8. FIG. 8 is a schematic side view illustrating a configuration of the substrate cleaning apparatus according to the third exemplary embodiment.

As illustrated in FIG. 8, the substrate cleaning apparatus 1C according to the third exemplary embodiment is provided with a cleaning body head unit 10C instead of the cleaning body head unit 10B. The cleaning body head unit 10C includes a cleaning body 11C instead of the cleaning body 11 provided in the cleaning body head unit 10B. The cleaning body 11C is, for example, a Bevel brush and comes into contact with the rear surface of a wafer W to clean the circumferential edge of the rear surface of the wafer W. When such a cleaning body 11C is used, a contact pressure in the direction opposite to the direction in each of the above-described exemplary embodiments, that is, a contact pressure in the vertical upward direction is applied to the wafer W. Meanwhile, other configurations of the cleaning body head unit 10C are the same as those of the cleaning body head unit 10B.

Also, the substrate cleaning apparatus 1C includes a third load detection unit 80 and a support member 81 instead of the second load detection unit 40 and the support member 41 provided in the substrate cleaning apparatus according to the first exemplary embodiment. The support member 81 is configured to support the third load detection unit 80 at a predetermined height and fixed to the front end portion of the third base member 34.

The third load detection unit 80 is a detection unit used to set the contact pressure of cleaning body 11C on a wafer W to a desired contact pressure. Specifically, the third load detection unit 80 is installed in such a manner that the bottom portion of one end is fixed to the top portion of the support member 81 and the bottom portion of the other end is contactable/separable with respect to the contacting portion 14d of the cleaning body head unit 10C.

In the substrate cleaning apparatus 1C configured as described above, the buoyancy value of the air cylinder 33 is determined as follows.

Firstly, the control unit obtains the output value (that is, the weight of the cleaning body head unit 10C) of the first load detection unit 20 in the stand-by state (that is, in the state in which the cleaning body 11C is not in contact with the wafer W and the contacting portion 14d of the cleaning body head unit 10C is not in contact with the third load detection unit 80) of the substrate cleaning apparatus 1C and resets the output value to zero.

Subsequently, the control unit elevates the elevating shaft 33b of the air cylinder 33 to a predetermined height so that the contacting portion 14d of the cleaning body head unit 10C comes into contact with the third load detection unit 80. Then, the control unit obtains the output value (that is, the current buoyancy value of the air cylinder 33) of the third load detection unit 80.

Subsequently, the control unit adjusts the pressure of the air supplied from the electro-pneumatic regulator 60 such that the output value obtained from the third load detection unit 80 of the output values coincides with the set value of the contact pressure stored in the storage unit of control device 4 (see, e.g., FIG. 1). Accordingly, the buoyancy value is determined.

Subsequently, the control unit elevates the third base member 34 to a predetermined position so that the cleaning body 11C comes into contact with the rear surface of the wafer W using the elevating mechanism 50 after rotating the cleaning body 11C by operating the rotating mechanism 13. Then, the control unit further elevates the third base member 34 by about 2 mm so that the contacting portion 14d is spaced apart from the third load detection unit 80. Accordingly, it becomes a state in which the desired contact pressure is applied to the wafer. Meanwhile, the control unit rotates the wafer W by controlling the substrate holding unit 2 in any timing until the cleaning body 11C comes into contact with the rear surface of the wafer W after the substrate cleaning processing is started.

Then, the control unit may obtain the output value from the first load detection unit 20 during the cleaning operation and detect the contact pressure of cleaning body 11C on the wafer W by reversing the output value.

As described above, even if the cleaning body 11C configured to clean the circumferential edge of the rear surface of the wafer W is used, the contact pressure of the cleaning body 11C on the wafer W may be detected during the cleaning operation as in the first and second exemplary embodiments.

Here, an example in which the substrate cleaning apparatus 1C is provided with the third load detection unit 80 and the support member 81 and the buoyancy value of air cylinder 33 is determined by using the third load detection unit 80 has been illustrated. However, a stage may be provided to determine the buoyancy value of the air cylinder 33 using the stage as in the second exemplary embodiment. In such a case, the third load detection unit 80 and the support member 81 are needless. Also, as in the substrate cleaning apparatus 1B illustrated in FIG. 7, the buoyancy value of the air cylinder 33 may be determined using a head support. In such a case, the head support 75 may be provided instead of the third load detection unit 80 illustrated in FIG. 8.

Also, in each of the above-describe exemplary embodiments, an example where the elevating shaft 33b of the air cylinder 33 is contactable/separable with respect to the second base member 31 has been illustrated. However, the elevating shaft 33b may be fixed to the second base member 31. With the configuration as described above, the followability of the cleaning body head units 10, 10B, 10C for the vertical movement of the elevating shaft 33b may be enhanced.

Further, in each of the above-describe exemplary embodiments, an example where the contact pressure of the cleaning body on a wafer has been described. However, a feedback control of the electro-pneumatic regulator 60 may be performed based on the detected contact pressure. That is, the control unit may calculate the difference of the detected contact pressure and the desired contact pressure and change the pressure of the air (that is, buoyancy value) supplied by the electrical pneumatic regulator 60 such that the difference is reduced. Moreover, the cleaning body may be substituted with a polishing member configured to remove a convex portion formed by contaminants attached to the rear surface of a substrate. In such a case, the substrate cleaning apparatus may be used as a substrate polishing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate cleaning apparatus comprising:
a cleaning body head unit in which a cleaning body configured to contact a substrate for a cleaning process, a shaft configured to support the cleaning body, and a rotating mechanism configured to rotate the shaft are connected to a first base member such that, when the cleaning body is moved in a vertical direction, the rotating mechanism is integrally moved in the vertical direction along with the cleaning body while the cleaning body, the shaft, and the rotating mechanism are connected to the first base member;
a first load detection unit including one end connected to the first base member of the cleaning body head unit to detect a load received from the cleaning body head unit; and
a buoyancy imparting unit connected to the other end of the first load detection unit to impart buoyancy to the cleaning body head unit via the first load detection unit,
wherein the buoyance imparting unit includes a second base member connected to the other end of the first load detection unit, a guide part configured to support the second base member such that the second base member becomes elevatable, a first elevating mechanism configured to elevate the second base member, and a third base member configured to retain the guide part and the first elevating mechanism, and
the third base member is connected to a second elevating mechanism separately from the first elevating mechanism such that the second base member, the guide part, and the first elevating mechanism are integrally elevated by the second elevating mechanism while being retained on the third base member;
wherein the first elevating mechanism includes an elevating shaft which is configured to be either in a contact state or in a separate state with respect to the second base member.

2. The substrate cleaning apparatus of claim 1, further comprising a second load detection unit configured to detect a load received from the second base member.

3. The substrate cleaning apparatus of claim 2, wherein the second load detection unit is retained by the third base member and is configured to be either in a contact state or in a separate state with respect to the second base member.

4. The substrate cleaning apparatus of claim 1, wherein the rotating mechanism includes:
a motor;
a first pulley attached to an output shaft of the motor;
a second pulley attached to the shaft; and
a transfer member extended between the first pulley and the second pulley.

5. The substrate cleaning apparatus of claim 1, wherein the first load detection unit is a Roberval-type load cell.

6. The substrate cleaning apparatus of claim 5, wherein the first load detection unit is connected with the first base member of the cleaning body head unit at the top surface of one end thereof and connected with the buoyancy imparting unit at the bottom surface of the other end thereof.

7. The substrate cleaning apparatus of claim 1, wherein the rotating mechanism includes a motor, a first pulley attached to a front end of an output shaft of the motor, and a second pulley attached to a front end of the shaft of the cleaning body, and a transfer belt is extended between the first pulley and the second pulley such that, when the cleaning body is moved in a vertical direction, the first pulley and the second pulley are integrally moved in the vertical direction along with the cleaning body.

8. The substrate cleaning apparatus of claim 7, wherein the motor is provided in a vicinity of the shaft of the cleaning body in a direction where an output shaft of the motor becomes parallel to the shaft of the cleaning body, and the first pulley and the second pulley are arranged at a substantially same height.

9. A substrate cleaning unit comprising:
a substrate holding unit configured to hold a substrate to be rotatable;
a substrate cleaning apparatus configured to clean the substrate held by the substrate holding unit; and
a control unit configured to control the substrate holding unit and the substrate cleaning apparatus,
wherein the substrate cleaning apparatus includes: a cleaning body head unit in which a cleaning body configured to contact a substrate for a cleaning process, a shaft configured to support the cleaning body, and a rotating mechanism configured to rotate the shaft are connected to a first base member such that, when the cleaning body is moved in a vertical direction, the rotating mechanism is integrally moved in the vertical direction along with the cleaning body while the cleaning body, the shaft, and the rotating mechanism are connected to the first base member; a first load detection unit including one end connected to the first base member of the cleaning body head unit to detect a load received from the cleaning body head unit; and a buoyancy imparting unit connected to the other end of the first load detection unit to impart buoyancy to the cleaning body head unit via the first load detection unit,
wherein the buoyance imparting unit includes a second base member connected to the other end of the first load detection unit, a guide part configured to support the second base member such that the second base member to be elevatable, and a first elevating mechanism configured to elevate the second base member, and a third base member configured to retain the guide part and the first elevating mechanism, and
the third base member is connected to a second elevating mechanism separately from the first elevating mechanism such that the second base member, the guide part, and the first elevating mechanism are integrally elevated by the second elevating mechanism while being retained on the third base member;
wherein the first elevating mechanism includes an elevating shaft which is configured to be either in a contact state or in a separate state with respect to the second base member.

10. The substrate cleaning unit of claim 9, wherein the substrate cleaning apparatus includes a second load detection unit configured to detect a load received from the second base member.

11. The substrate cleaning unit of claim 10, wherein the control unit determines a load imparted by the buoyancy imparting unit to the cleaning body head unit based on an output value of the second load detection unit and detects a contact pressure of the cleaning body on the substrate based on an output value of the first load detection unit.

* * * * *